United States Patent
Löffler et al.

(10) Patent No.: US 10,475,951 B2
(45) Date of Patent: Nov. 12, 2019

(54) OPTOELECTRONIC SEMICONDUCTOR CHIP AND METHOD FOR THE PRODUCTION THEREOF

(71) Applicant: OSRAM Opto Semiconductors GmbH, Regensburg (DE)

(72) Inventors: Andreas Löffler, Neutraubling (DE); Tobias Meyer, Ihrlerstein (DE); Adam Bauer, Donaustauf (DE); Christian Leirer, Friedberg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/780,982

(22) PCT Filed: Mar. 28, 2014

(86) PCT No.: PCT/EP2014/056328
§ 371 (c)(1),
(2) Date: Sep. 28, 2015

(87) PCT Pub. No.: WO2014/166764
PCT Pub. Date: Oct. 16, 2014

(65) Prior Publication Data
US 2016/0056326 A1 Feb. 25, 2016

(30) Foreign Application Priority Data

Apr. 10, 2013 (DE) .......... 10 2013 103 602

(51) Int. Cl.
*H01L 33/00* (2010.01)
*H01L 33/02* (2010.01)
(Continued)

(52) U.S. Cl.
CPC ...... *H01L 33/0062* (2013.01); *H01L 21/0242* (2013.01); *H01L 21/0254* (2013.01);
(Continued)

(58) Field of Classification Search
CPC ....... H01L 33/025; H01L 33/04; H01L 33/06; H01L 33/12; H01L 33/325
(Continued)

(56) References Cited

U.S. PATENT DOCUMENTS 5,577,062 A 11/1996 Takahashi
5,801,071 A * 9/1998 Takahashi .............. B82Y 20/00
148/DIG. 50
(Continued)

FOREIGN PATENT DOCUMENTS

DE 102009060747 A1 7/2011
DE 102009060750 A1 7/2011
(Continued)

OTHER PUBLICATIONS

Monga ("Thermodynamics Studies on the Synthesis of Nitrides and Epitaxial Growth of InGaN", Master of Science Thesis (2007)).*
(Continued)

*Primary Examiner* — Bo Fan
(74) *Attorney, Agent, or Firm* — Slater Matsil, LLP

(57) ABSTRACT

A method for producing an optoelectronic semiconductor chip is disclosed. A substrate is provided and a first layer is grown. An etching process is carrying out to initiate V-defects. A second layer is grown and a quantum film structure is grown. An optoelectronic semiconductor chip is also disclosed. The method can be used to produce the optoelectronic semiconductor chip.

18 Claims, 2 Drawing Sheets

(51) Int. Cl.
   *H01L 33/24* (2010.01)
   *H01L 21/02* (2006.01)
   *H01L 33/06* (2010.01)
   *H01L 33/30* (2010.01)
   *H01L 25/16* (2006.01)
   *H01L 33/32* (2010.01)

(52) U.S. Cl.
   CPC .. *H01L 21/02458* (2013.01); *H01L 21/02494* (2013.01); *H01L 21/02505* (2013.01); *H01L 21/02658* (2013.01); *H01L 33/007* (2013.01); *H01L 33/025* (2013.01); *H01L 33/06* (2013.01); *H01L 33/24* (2013.01); *H01L 33/30* (2013.01); *H01L 25/167* (2013.01); *H01L 33/32* (2013.01); *H01L 2924/0002* (2013.01)

(58) Field of Classification Search
   USPC .......................... 257/13, 311, 384, 506, 401
   See application file for complete search history.

(56) References Cited

U.S. PATENT DOCUMENTS

| | | | | |
|---|---|---|---|---|
| 5,814,839 A * | 9/1998 | Hosoba | H01L 33/145 | 257/102 |
| 6,329,667 B1 * | 12/2001 | Ota | H01L 33/02 | 257/103 |
| 6,623,560 B2 | 9/2003 | Biwa et al. | | |
| 6,693,303 B2 * | 2/2004 | Ota | H01L 33/02 | 257/79 |
| 6,741,623 B2 * | 5/2004 | Ishikawa | B82Y 20/00 | 257/103 |
| 7,037,741 B2 * | 5/2006 | Tasi | H01L 33/025 | 438/38 |
| 7,446,345 B2 | 11/2008 | Emerson et al. | | |
| 7,759,689 B2 * | 7/2010 | Bour | H01L 33/32 | 257/96 |
| 7,952,109 B2 * | 5/2011 | Ng | H01L 33/24 | 257/13 |
| 8,030,640 B2 * | 10/2011 | Oh | H01L 33/18 | 257/13 |
| 8,129,711 B2 * | 3/2012 | Kang | H01L 33/0075 | 257/17 |
| 8,134,170 B2 * | 3/2012 | Oh | H01L 21/0237 | 257/14 |
| 8,148,252 B1 * | 4/2012 | Figuet | C30B 25/02 | 257/E21.097 |
| 8,247,314 B2 * | 8/2012 | Arena | H01L 21/02458 | 438/478 |
| 8,377,796 B2 * | 2/2013 | Yu | H01L 21/0237 | 257/E21.575 |
| 8,399,877 B2 * | 3/2013 | Jeong | H01L 33/32 | 257/13 |
| 8,409,892 B2 * | 4/2013 | Peng | H01L 21/0242 | 257/E21.113 |
| 8,426,887 B2 * | 4/2013 | Son | H01L 33/24 | 257/103 |
| 8,536,594 B2 * | 9/2013 | Odnoblyudov | H01L 33/382 | 257/91 |
| 8,698,163 B2 * | 4/2014 | Ting | H01L 21/02458 | 257/13 |
| 8,748,867 B2 * | 6/2014 | Jeong | H01L 33/04 | 257/15 |
| 8,748,932 B2 * | 6/2014 | Jeong | H01L 33/10 | 257/103 |
| 8,816,321 B2 | 8/2014 | Takeoka et al. | | |
| 8,900,888 B2 * | 12/2014 | Gmeinwieser | H01L 33/08 | 257/E33.06 |
| 8,932,943 B2 * | 1/2015 | Cheon | H01L 33/04 | 438/491 |
| 8,937,325 B2 * | 1/2015 | Kushibe | H01L 33/06 | 257/94 |
| 8,952,400 B2 * | 2/2015 | Jung | H01L 33/02 | 257/257 |
| 9,006,778 B2 * | 4/2015 | Nozaki | H01L 33/22 | 257/103 |
| 9,029,177 B2 | 5/2015 | Butendeich et al. | | |
| 9,048,385 B2 | 6/2015 | Sanga | | |
| 9,159,875 B2 * | 10/2015 | Cheon | H01L 33/007 | |
| 9,202,978 B2 | 12/2015 | Löffler et al. | | |
| 9,293,647 B2 * | 3/2016 | Kashihara | H01L 33/24 | |
| 9,496,454 B2 * | 11/2016 | Odnoblyudov | H01L 33/0095 | |
| 9,502,611 B2 * | 11/2016 | Leirer | H01L 33/06 | |
| 2002/0078881 A1 * | 6/2002 | Cuomo | C23C 14/0063 | 117/84 |
| 2002/0084452 A1 | 7/2002 | Ota et al. | | |
| 2006/0246612 A1 | 11/2006 | Emerson et al. | | |
| 2007/0122994 A1 * | 5/2007 | Sonobe | B82Y 20/00 | 438/426 |
| 2009/0014713 A1 | 1/2009 | Kang et al. | | |
| 2009/0029493 A1 | 1/2009 | Emerson et al. | | |
| 2009/0101934 A1 * | 4/2009 | Massies | H01L 33/08 | 257/103 |
| 2010/0133562 A1 * | 6/2010 | Zhang | H01L 33/24 | 257/94 |
| 2010/0155704 A1 | 6/2010 | Oh et al. | | |
| 2010/0207097 A1 | 8/2010 | Oh et al. | | |
| 2011/0121357 A1 * | 5/2011 | Lester | H01L 21/0237 | 257/103 |
| 2011/0133156 A1 * | 6/2011 | Won | H01L 33/06 | 257/13 |
| 2011/0260192 A1 * | 10/2011 | Kwak | H01L 33/56 | 257/98 |
| 2012/0017825 A1 * | 1/2012 | D'Evelyn | C30B 9/08 | 117/58 |
| 2012/0032137 A1 | 2/2012 | Schellhammer | | |
| 2012/0205618 A1 * | 8/2012 | Nakamura | H01L 33/007 | 257/13 |
| 2012/0298964 A1 | 11/2012 | Peter et al. | | |
| 2013/0037779 A1 | 2/2013 | Takeoka et al. | | |
| 2013/0181215 A1 * | 7/2013 | Adekore | H01L 29/12 | 257/43 |
| 2013/0234107 A1 * | 9/2013 | Cheon | H01L 33/04 | 257/13 |
| 2014/0057417 A1 | 2/2014 | Leirer et al. | | |
| 2014/0183594 A1 | 7/2014 | Löffler et al. | | |
| 2015/0276950 A1 * | 10/2015 | Bensaoula | G01T 3/08 | 257/76 |
| 2016/0056244 A1 * | 2/2016 | Dasgupta | H01L 29/0649 | 257/183 |
| 2016/0056326 A1 | 2/2016 | Loffler et al. | | |
| 2016/0308041 A1 * | 10/2016 | Then | H01L 21/84 | |
| 2017/0236936 A1 * | 8/2017 | Then | H01L 29/7848 | 257/76 |

FOREIGN PATENT DOCUMENTS

| | | |
|---|---|---|
| DE | 102011012925 A1 | 9/2012 |
| DE | 102011100037 A1 | 10/2012 |
| EP | 2398076 A2 | 12/2011 |
| JP | H07183618 A | 7/1995 |
| JP | 2002033288 A | 1/2002 |
| JP | 2000232238 A | 8/2008 |
| JP | 2008539585 A | 11/2008 |
| JP | 2010153838 A | 7/2010 |
| JP | 2013502722 A | 1/2013 |
| JP | 2013512567 A | 4/2013 |
| JP | 2016518712 A | 6/2013 |
| JP | 6218920 B2 | 10/2017 |
| TW | 200638563 A | 11/2006 |
| TW | 201314947 A | 4/2013 |
| WO | 2010150809 A1 | 12/2010 |

(56) References Cited

FOREIGN PATENT DOCUMENTS

WO        2011080219 A1     7/2011
WO        2012146668 A1    11/2012

OTHER PUBLICATIONS

Hangleiter et al. ("Suppression of Nonradiative Recombination by V-Shaped Pits in GaInN/GaN Quantum Wells Produces a Large Increase in the Light Emission Efficiency"), Physical Review Letters 95 (2005) 127402.*

* cited by examiner

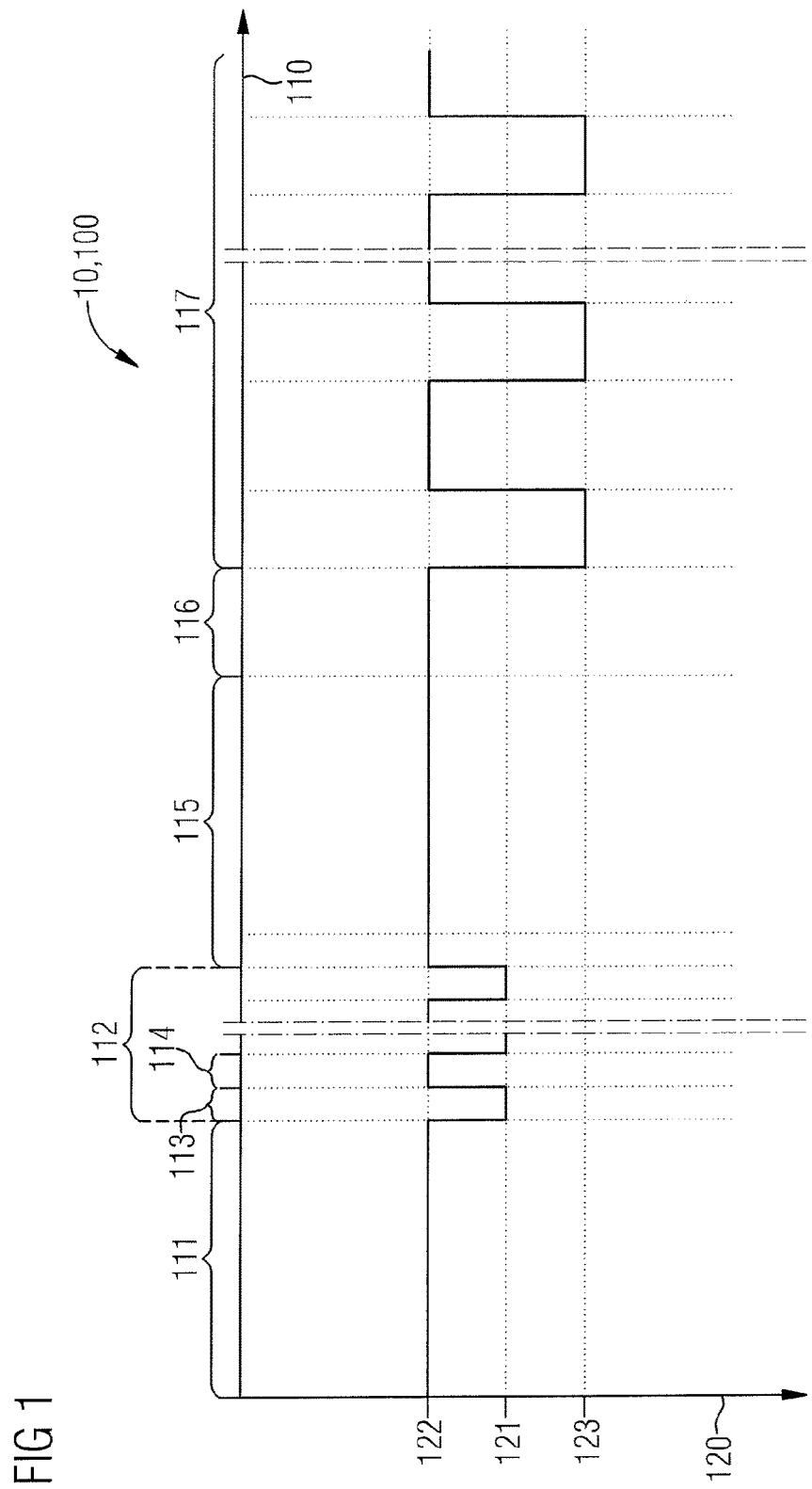

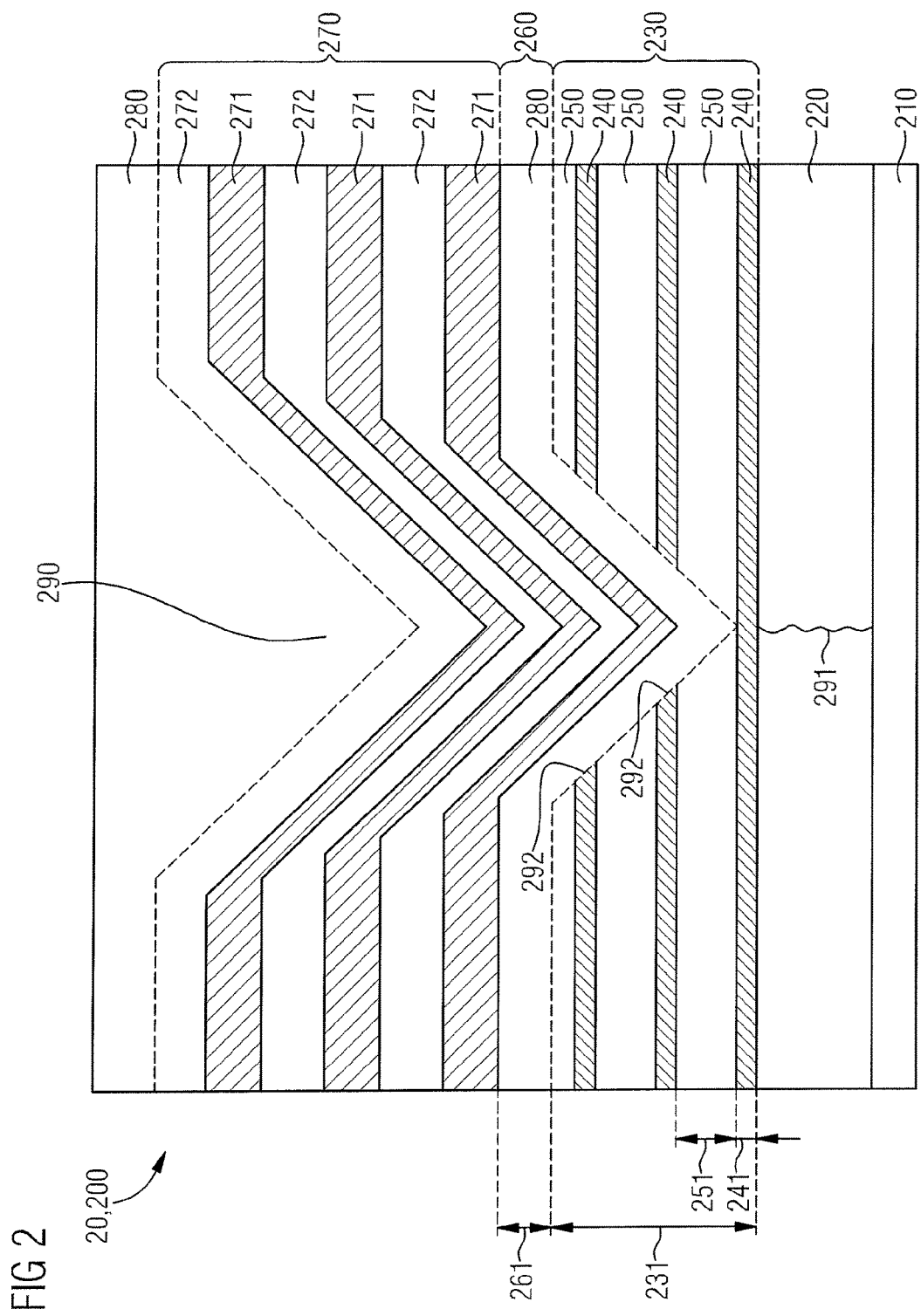

OPTOELECTRONIC SEMICONDUCTOR CHIP AND METHOD FOR THE PRODUCTION THEREOF

This patent application is a national phase filing under section 371 of PCT/EP2014/056328, filed Mar. 28, 2014, which claims the priority of German patent application 10 2013 103 602.3, filed Apr. 10, 2013, each of which is incorporated herein by reference in its entirety.

TECHNICAL FIELD

The present invention relates to a method for producing an optoelectronic semiconductor chip.

BACKGROUND

It is known that nitride semiconductor chips, for example, optoelectronic nitride semiconductor chips, may be permanently damaged or destroyed even by very small electrostatic discharges (ESD). If a substrate comprising sapphire is used in the production of such semiconductor chips, a crystal with a high dislocation density arises during epitaxial growth of a nitride semiconductor layer sequence. These dislocations act as leakage current paths, via which leakage currents flow in the case of an ESD load, which may lead to damage or destruction of the nitride semiconductor chip.

To prevent damage by electrostatic discharges, protective measures are needed. It is known from German patent publication DE 10 2009 060 750 A1 to provide an optoelectronic semiconductor chip with microdiodes integrated into a semiconductor layer sequence, which microdiodes provide protection from damage by electrostatic discharges. The microdiodes are formed by V-defects arranged in an active layer of the semiconductor layer sequence. The V-defects are created by selecting suitable growth parameters during epitaxial growth of the semiconductor layer sequence. This also leads, however, to a reduction in crystal quality in regions of the active layer arranged outside the V-defects, which may result in reduced light output in the case of a light-emitting diode semiconductor chip.

SUMMARY

Embodiments of the present invention provide a method for producing an optoelectronic semiconductor chip. Further embodiments of the present invention provide an optoelectronic semiconductor chip.

In particular, in the method described here V-defects may be created without having to modify growth conditions for the creation thereof. Specifically selected growth conditions merely serve in obtainment of the V-defects. Since it is not necessary to adapt the growth conditions to the creation of the V-defects, it is possible to grow epitaxial layers with a high crystalline quality which contain V-defects. This allows the production of ESD-stable semiconductor chips without a simultaneous loss of brightness or a reduction in light output due to crystal defects.

A method for producing an optoelectronic semiconductor chip comprises steps of providing a substrate, of growing a first layer, of carrying out an etching process to initiate V-defects, of growing a second layer, and of growing a quantum film structure. The first and the second layers may comprise layers of a nitride compound semiconductor material, such as, for example, InGaN. Advantageously, this method allows the production of an optoelectronic semiconductor chip, in the quantum film structure of which V-defects are embedded. These V-defects may act as ESD protection diodes connected in parallel with the quantum film structure. Initiation of the V-defects by means of the etching process advantageously introduces only slight morphological imperfections into the crystal of the optoelectronic semiconductor chip, whereby a significant reduction in the light output of the optoelectronic semiconductor chip may be avoided. Furthermore, the etching process advantageously makes it possible to initiate V-defects of a defined size and with a homogeneous size distribution.

In one embodiment of the method, growth of the first layer comprises growth of at least one first sublayer and one second sublayer. In this case, the first sublayer comprises a different aluminum content and/or a different indium content from the second sublayer. Advantageously, the first layer allows the initiation of V-defects which propagate during further growth through the second layer and the quantum film structure. Subdivision of the first layer into a first sublayer and a second sublayer allows precise control of an indium content and/or an aluminum content and/or doping and/or further characteristics of the first layer.

Layer growth may take place in an epitaxy facility by means of, for example, MOVPE at a predetermined reactor temperature with the addition of precursor gases such as, for example, trimethylgallium, triethylgallium, ammonia and/or hydrogen.

Growth of the second layer may here proceed by means of cold growth. The reactor temperature during growth of the second layer may be at least 50 K, at least 100 K and particularly preferably at least 200 K lower than the reactor temperature during growth of the first layer. For example, during growth of the second layer the reactor temperature amounts to from at least 700° C. to at most 900° C. For growth of the first layer, the reactor temperature may be selected in the range between at least 700° C. and at most 1100° C., preferably in a range from at least 900° C. to at most 1100° C. The first layer may thus be grown by means of hot growth. In the method it is thus possible to grow the first layer with smoothing hot growth, which is performed at a reactor temperature of at least 900° C. Hot growth may result in particularly good crystalline quality of the layers grown. The specific growth conditions of the second layer serve merely to obtain the V-defects, but are not necessary for the creation thereof. The V-defects are created by means of the etching method described here.

In one embodiment of the method, the first sublayer is grown with a first indium content and the second sublayer is grown with a second indium content. In this case, the first indium content is at least as high as the second indium content. Subdivision of the first layer into the first sublayer and the second sublayer thereby allows precise control of an indium content of the first layer.

In one embodiment of the method, a plurality of first sublayers and second sublayers are in each case grown alternately. Advantageously, an increase in the number of sublayers of the first layer results in a first layer homogeneity which is increased on average.

In one embodiment of the method, an opening is created in at least one first sublayer during the etching process. Advantageously, material of the second layer may accumulate in the opening in the first sublayer, whereby a V-defect created in the first layer propagates into the second layer and the quantum film structure. Preferably, the opening may pass completely through the at least one first sublayer.

In one embodiment of the method, the etching process is carried out within an epitaxy facility. There is thereby advantageously no need to remove the layer sequence of the optoelectronic semiconductor chip from the epitaxy facility to carry out the etching process, thus making the method quick and inexpensive to perform. Moreover, a risk associated with removal from the epitaxy facility of soiling of or damage to the layer sequence of the optoelectronic semiconductor chip is advantageously avoided.

Etching within an epitaxy facility may take place, for example, by means of etch back in the reactor facility. To this end, the supply of gallium, i.e., the supply of trimethyl- and/or triethylgallium, to the facility may be greatly reduced or dispensed with completely. In addition, the supply of hydrogen may be increased and/or the supply of ammonia reduced. In this way, a layer addition rate, i.e., the rate of layer growth, may be reduced to such an extent that a layer decomposition rate, i.e., the rate of layer dissolution during growth, due to, for example, reactions with hydrogen, predominates and gives rise to a negative growth rate. For example, the addition rate during normal layer growth amounts to 2 nm to 100 nm per minute, while the decomposition rate during normal layer growth amounts to at most 1 nm per minute, thus giving rise at normal layer growth to a net positive growth rate. When etching back the addition rate is lower than the decomposition rate, so giving rise to a net negative growth rate, i.e., an etching process.

In one embodiment of the method, growth is interrupted during the etching process. In this case, hydrogen is supplied to the epitaxy facility during the etching process. Advantageously, hydrogen is suitable for initiating V-defects in the previously grown first layer. Through the supply of hydrogen, the above-described etch back may occur.

In another embodiment of the method, the etching process is carried out outside an epitaxy facility. Advantageously, the etching process may thereby proceed, for example, in a specialized etching facility, thus making the etching conditions particularly precisely controllable. The etching process may be a wet chemical etching process, for example, using phosphoric acid, or a dry chemical etching process, for example, using a plasma.

An optoelectronic semiconductor chip comprises a first layer, a second layer, which is arranged above the first layer, and a quantum film structure, which is arranged above the second layer. In this case, the first layer comprises at least one first sublayer and one second sublayer. The first sublayer has a different aluminum content and/or a different indium content from the second sublayer. Moreover, the semiconductor chip comprises at least one V-defect, which extends at least through parts of the first layer, second layer and quantum film structure. In addition, at least one first sublayer is broken through in the region of the V-defect. At least one first sublayer may in particular be completely broken through in the region of the V-defect.

Advantageously, the V-defect of this optoelectronic semiconductor chip acts as a protection diode connected in parallel with the quantum film structure, which diode prevents damage to the optoelectronic semiconductor chip through electrostatic discharges. In this case, the layers of the optoelectronic semiconductor chip have a high crystal quality, whereby a high light output is achievable with the optoelectronic semiconductor chip.

In one embodiment of the optoelectronic semiconductor chip, the first sublayer comprises a first indium content and the second sublayer a second indium content. In this case, the first indium content is at least as high as the second indium content. Subdivision of the first layer into the first sublayer and the second sublayer advantageously allows precise control of an indium content of the first layer.

In one embodiment of the optoelectronic semiconductor chip, the first indium content amounts to between 0% and 12%, preferably between 1% and 3%. In particular, the first indium content may amount to approximately 2%. Tests have shown that an optoelectronic semiconductor chip with a first indium content of this magnitude may have a particularly favorable crystal quality.

In one embodiment of the optoelectronic semiconductor chip, the second indium content amounts to at most 6% and preferably 0%. Tests have shown that an optoelectronic semiconductor chip with a second indium content of this magnitude may have a particularly favorable crystal quality.

In one embodiment of the optoelectronic semiconductor, a plurality of first sublayers and second sublayers follow one another alternately. Tests have demonstrated that an increase in the number of sublayers of the first layer permits a particularly advantageous crystal quality.

In one embodiment of the optoelectronic semiconductor chip, the first layer comprises between 2 and 100 sublayers, preferably approximately 20 first sublayers. Tests have demonstrated that a first layer with this number of sublayers permits an optoelectronic semiconductor chip with a particularly favorable crystal quality.

In one embodiment of the optoelectronic semiconductor chip, the first layer comprises doping with an average degree of doping of between 0 and $1\times10^{19}$ per cubic centimeter, preferably doping with an average degree of doping of between $2\times10^{18}$ per cubic centimeter and $6\times10^{18}$ per cubic centimeter. These values have advantageously proven favorable in tests.

In one embodiment of the optoelectronic semiconductor chip, the second sublayers comprise doping while the first sublayers have no or only slight doping. Advantageously, the first layer then overall comprises modulation doping. An inverse doping profile is also possible, in which the second sublayers are slightly doped or undoped and the first sublayers have a higher degree of doping.

In one embodiment of the optoelectronic semiconductor chip, at least two first sublayers are doped with different degrees of doping. Advantageously, the degree of doping of the first layer varies in the growth direction in the case of this optoelectronic semiconductor chip.

In one embodiment of the optoelectronic semiconductor chip, successive first sublayers comprise degrees of doping which diminish in the direction of the second layer. Advantageously, such a doping profile has proven favorable in tests.

In one embodiment of the optoelectronic semiconductor chip, the second layer has a thickness of between 1 nm and 120 nm, preferably a thickness of between 10 nm and 30 nm, particularly preferably a thickness of between 15 nm and 25 nm. The thickness of the second layer may, for example, amount to approximately 20 nm. Tests have shown that a second layer with such a thickness may be suitable for compensating defects introduced into the first layer during an etching process, without at the same time filling in V-defects initiated in the first layer during the etching process.

In one embodiment of the optoelectronic semiconductor chip, every first sublayer has a thickness of between 0.5 nm and 10 nm. In this case, every second sublayer has a thickness of between 0.5 nm and 30 nm. For example, every first sublayer may have a thickness of approximately 2 nm, while every second sublayer has a thickness of approximately 4 nm. Advantageously, such layer thicknesses have proven favorable in tests.

BRIEF DESCRIPTION OF THE DRAWINGS

The above-described characteristics, features and advantages of this invention and the manner in which these are achieved will become clearer and more distinctly comprehensible from the following description of the exemplary embodiments, which are explained in greater detail in connection with the drawings. In the figures FIG. 1 shows a time-dependent growth diagram of a method for producing an optoelectronic semiconductor chip; and FIG. 2 is a schematic diagram of a multilayer structure of an optoelectronic semiconductor chip.

DETAILED DESCRIPTION OF ILLUSTRATIVE EMBODIMENTS

FIG. 1 is a schematic diagram of a growth diagram 100 for explaining a method 10 for producing an optoelectronic semiconductor chip 20. FIG. 2 is a highly schematic diagram of a multilayer structure 200 of the optoelectronic semiconductor chip 20 which may be produced using the production method 10 shown in FIG. 1.

The optoelectronic semiconductor chip 20 may, for example, be a light-emitting diode chip (LED chip). The multilayer structure 200 of the optoelectronic semiconductor chip 20 comprises layers of a nitride compound semiconductor material. The nitride compound semiconductor material may, for example, be InGaN.

The multilayer structure 200 is produced by epitaxial growth and an etching process. A time profile of the production method 10 is shown in the growth diagram 100 of FIG. 1. Progressing time 110 is plotted on a horizontal axis of the growth diagram 100. Plotted on a vertical axis of the growth diagram 100 is an indium concentration 120 established in a layer of the multilayer structure 200 grown at the respective time 110 in an epitaxy facility.

The production method 10 begins with provision of a substrate 210. The substrate 210 may comprise sapphire, for example. Prior to carrying out the method steps explained below of the production method 10, one or more layers may already have been formed on the surface of the substrate 210.

During a first time period 111 an n-doped layer 220 is grown. The n-doped layer 220 has a second indium concentration 122. The second indium concentration 122 preferably amounts to at most 6% and may, for example, amount to the value 0. In this case the n-doped layer 220 may, for example, comprise GaN without an indium content. The n-doped layer 220 is formed with n-doping.

During a second time period 112, which follows the first time period 111, a first layer 230 is grown. The first layer 230 is preferably constructed from a plurality of first sublayers 240', 240", and 240''', and second sublayers 250', 250", 250''', which alternate respectively. In this case, the second time period 112 firstly comprises a first time sub-period 113, during which a first sublayer 240' is grown. This is then followed by a second time sub-period 114, during which a second sublayer 250' is grown. This is followed in turn by a first time sub-period 113, during which a further first sublayer 240" is grown. A new second time sub-period 114 then follows, which serves to grow a further second sublayer 250". This sequence continues repeatedly throughout the second time period 112, until the first layer 230, which is with the plurality of alternating first sublayers 240', 240", and 240''' and second sublayers 250', 250", 250''', is fully grown.

The first layer 230 may comprise between one and, for example, a hundred first sublayers 240 and a corresponding number of second sublayers 250. The first layer 230 preferably comprises twenty first sublayers 240 and twenty second sublayers 250. The second time period 112 comprises a corresponding number of alternating first time sub-periods 113 and second time sub-periods 114.

The first sublayers 240', 240", and 240''' are preferably grown with a first indium concentration 121. The second sublayers 250', 250", 250''' are then grown with the second indium concentration 122. The first indium concentration 121 is preferably at least as high as the second indium concentration 122. The first indium concentration 121 preferably amounts to between 0% and 12%. The first indium concentration 121 in the first sublayers 240 particularly preferably amounts to between 1% and 3%. The first indium concentration 121 in the first sublayers 240', 240", and 240''' may, for example, amount to approximately 2%. The second indium concentration 122 in the second sublayers 250', 250", 250''' is in turn preferably at most 6%, particularly preferably approximately 0%.

It is also possible for the first sublayers 240', 240", and 240''' not to differ from the second sublayers 250', 250", 250''' in a different indium concentration 121, 122, but rather in a different aluminum concentration. The aluminum concentration may here be in each case between 0% and 30% in the first sublayers 240', 240", and 240''' and the second sublayers 250', 250", 250'''. The aluminum concentration in the first sublayers 240', 240", and 240''' and the second sublayers 250', 250", 250''' preferably amounts to 0%, however. It is also possible for the first sublayers 240', 240", and 240''' and the second sublayers 250', 250", 250''' to have both differing indium concentrations 121, 122 and differing aluminum concentrations.

The first layer 230 is preferably doped with an average degree of doping of between 0 and $1\times10^{19}$ per cubic centimeter. Particularly preferably, the first layer 230 is doped with an average degree of doping which is between $2\times10^{18}$ per cubic centimeter and $6\times10^{18}$ per cubic centimeter. The average degree of doping may, for example, be approximately $4\times10^{18}$ per cubic centimeter.

The first layer 230 may be uniformly doped over its entire thickness in the growth direction. The degree of doping of the first layer 230 may however also vary in the growth direction of the first layer 230. Doped and undoped layer portions with respective thicknesses in the range of a few nanometers may also alternate in the growth direction of the first layer 230.

In a preferred embodiment, the first layer 230 is modulation-doped. In this case, the first sublayers 240', 240", and 240''' of the first layer 230 are undoped or doped with a low degree of doping. The second sublayers 250', 250", 250''' of the first layer 230 comprise silicon doping. Successive second sublayers 250', 250", 250''' of the first layer 230 may in this case be doped with different degrees of doping. Preferably, the degree of doping of the second sublayers 250', 250", 250''' of the first layer 230 decreases as the distance from the n-doped layer 220 increases, i.e., as the second time period 112 elapses. An inverse doping profile is also possible, in which the second sublayers 250', 250", 250''' are slightly doped or undoped and the first sublayers 240', 240", and 240''' have a higher degree of doping.

The first sublayers 240', 240", and 240''' each have a first sublayer thickness 241 in the direction of growth. The second sublayers 250', 250", 250''' of the first layer 230 each have a second sublayer thickness 251 in the direction of growth. The first sublayer thickness 241 may be between 0.5 nm and 10 nm. The second sublayer thickness 251 may be between 0.5 nm and 20 nm. The first sublayer thickness 241 may, for example, amount to approximately 2 nm and the second sublayer thickness 251 to approximately 4 nm. In the direction of growth the first layer 230 has overall a first layer thickness 231 which results from multiplying the sum of first sublayer thickness 241 and second sublayer thickness 251 with the number of repeats of first sublayer 240', 240", and 240''' and second sublayer 250', 250", 250'''.

During a third time period 115, which follows the second time period 112 chronologically, an etching process is carried out to initiate V-defects in the first layer 230 of the multilayer structure 200. V-defects (V-pits) are defects which in nitride compound semiconductor material may have the shape, for example, of an open pyramid inverted in the direction of growth and with a, for example, hexagonal base area. In the cross-sectional representation of FIG. 2, a V-defect 290 thus has the shape of a V opening in the growth direction.

It is known that V-defects may be initiated during epitaxial growth by a selection of specific growth parameters, in particular a specific growth temperature. These specific growth parameters may however reduce the crystal quality of a crystal grown during epitaxial growth. The production method 10 for producing the multilayer structure 200 therefore provides creating the V-defects 290 by means of an etching process only after growth of the first layer 230. This has the advantage that the regions of the first layer 230 remaining between the V-defects 290 may be formed with a higher crystal quality. In particular, the surface of the first layer 230 may be morphologically smoother.

Threading dislocations 291 extending in the direction of growth may already have formed in the n-doped layer 220 during growth of the n-doped layer 220 in the first time period 111. These threading dislocations 291 also continue through the first layer 230 during epitaxial growth of the first layer 230 in the second time period 112. The V-defects 290 formed in the third time period 115 by means of the etching process preferably form at such threading dislocations 291.

Through the etching process in the third time period 115, a part of the first layer 230 with the first sublayers 240', 240", and 240''' and the second sublayers 250', 250", and 250''' is removed in the region of the initiated V-defects 290. In this way, at least one or more of the first sublayers 240', 240", and 240''' of the first layer 230 are thereby broken completely through, such that an opening 292 forms openings 292" and 292''' form in these first sublayers 240', 240", and 240'''. Corresponding openings also form in the second sublayers 250', 250", and 250''' of the first layer 230.

The etching process during the third time period 115 may proceed in the epitaxy facility, in which the first layer 230 was also grown. To this end, hydrogen may, for example, be supplied to the epitaxy facility. In the process, the epitaxial growth in the epitaxy facility is interrupted. Alternatively, the etching process may also be performed outside the epitaxy facility during the third time period 115.

The V-defects 290 initiated by the etching process during the third time period 115 may have a defined size and a homogeneous size distribution.

During a fourth time period 116, which follows the third time period 115, a second layer 260 is grown epitaxially. The second layer 260 serves to space the subsequently grown quantum film structure from the processed first layer 230.

The second layer 260 is preferably grown with the second indium concentration 122, such that in the second layer 260 only a small indium content of between 0% and 6%, particularly preferably an indium content of 0%, is established.

The second layer 260 is formed with a second layer thickness 261 in the direction of growth. The second layer thickness 261 is preferably between 1 nm and 120 nm. Particularly preferably, the second layer thickness 261 is between 10 nm and 30 nm. In particular, the second layer thickness 261 may be between 15 nm and 25 nm. For example, the second layer thickness 261 of the second layer 260 may amount to 20 nm.

The second layer 260 is also grown in the region of the V-defects 290. In this way, the V-defects 290 continue from the first layer 230 through the second layer 260.

During a fifth time period 117, which follows the fourth time period 116 chronologically, a quantum film structure 270 is grown. The quantum film structure 270 forms an active layer of the multilayer structure 200 of the optoelectronic semiconductor chip 20.

The quantum film structure 270 comprises successive quantum films 271 and barriers 272 alternating in the direction of growth. The quantum film structure 270 may, for example, comprise between 1 and 20 quantum films 271, preferably between 3 and 10 quantum films 271, particularly preferably 6 quantum films 271, and a corresponding number of barriers 272.

The quantum films 271 of the quantum film structure 270 are preferably grown with a third indium concentration 123 which is higher than the first indium concentration 121. The barriers 272 are preferably grown with the second indium concentration 122. Thus, the barriers 272 preferably have only a low indium content of at most 6% or absolutely no indium content.

The sublayers 271, 272 of the quantum film structure 270 are also grown in the region of the V-defects 290 during the growth of the quantum film structure 270, whereby the V-defects 290 continue through the quantum film structure 270. In the quantum film structure 270 the V-defects 290 form microdiodes in a known manner, which serve to protect the optoelectronic semiconductor chip 20 from damage due to electrostatic discharge.

In a further step of the production method 10, which is not shown in the growth diagram 100 of FIG. 1, a p-doped layer 280 may then also be grown on the quantum film structure 270 of the multilayer structure 200 of the optoelectronic semiconductor chip 20.

The invention has been illustrated and described in greater detail with reference to the preferred exemplary embodiments. The invention is nevertheless not restricted to the disclosed examples. Rather, other variations may be derived therefrom by a person skilled in the art without going beyond the scope of protection of the invention.

The invention claimed is:

1. A method for producing an optoelectronic semiconductor chip, the method comprising:
   providing a substrate;
   growing a first layer, wherein the first layer includes a plurality of first sublayers with a first indium content, and a plurality of second sublayers with a second indium content, and wherein the first layer comprises successive first sublayers and second sublayers alternating one another;
   after growing the first layer, performing an etching process to initiate V-defects, wherein the etching process creates an opening in at least one first sublayer and at least one second sublayer, the opening extending completely through the at least one first sublayer and the at least one second sublayer;

after performing the etching process, growing a second layer; and after growing the second layer, growing a quantum film structure, wherein an active layer of the optoelectronic semiconductor chip is disposed in the quantum film structure, and wherein, with respect to the plurality of first sublayers, each successive first sublayer has a degree of doping that is diminished relative to a degree of doping of a prior first sublayer, in a direction toward the second layer.

2. The method according to claim 1, wherein growing the first layer comprises growing a first sublayer of the plurality of first sublayers and a second sublayer of the plurality of second sublayers, wherein an opening is created in the first sublayer, which is grown, during the etching process, and wherein the opening extends completely through the first sublayer, where the opening is created.

3. The method according to claim 1, wherein growing the first layer comprises growing the plurality of first sublayers and the plurality of second sublayers, and wherein the plurality of first sublayers have a different aluminum content or a different indium content than the plurality of second sublayers.

4. The method according to claim 3, wherein the plurality of first sublayers are grown with the first indium content, and the plurality of second sublayers are grown with the second indium content, the first indium content being at least as high as the second indium content.

5. The method according to claim 1, wherein the etching process is carried out within an epitaxy facility.

6. The method according to claim 5, wherein growth is interrupted during the etching process, and wherein hydrogen is supplied to the epitaxy facility during the etching process.

7. The method according to claim 1, wherein the etching process is carried out outside an epitaxy facility.

8. The method according to claim 4, wherein the first indium content in each first sublayer of the plurality of first sublayers amounts to between 0% and 12%.

9. The method according to claim 8, wherein the second indium content in each second sublayer of the plurality of second sublayers amounts to at most 6%.

10. The method according to claim 1, wherein the first layer comprises between 2 and 100 first sublayers.

11. The method according to claim 1, wherein the second layer has a thickness of between 1 nm and 120 nm.

12. The method according to claim 1, wherein each first sublayer of the plurality of first sublayers has a thickness of between 0.5 nm and 10 nm, and each second sublayer of the plurality of second sublayers has a thickness of between 0.5 nm and 30 nm.

13. A method for producing an optoelectronic semiconductor chip, the method comprising:

providing a substrate;

growing a first layer including a plurality of first sublayers and a plurality of second sublayers, the first sublayers having a different aluminum concentration or a different indium content than the second sublayers, wherein the first sublayers are grown with a first indium content and the second sublayers are grown with a second indium content, the first indium content being at least as high as the second indium content, wherein the first sublayers and the second sublayers alternating one another;

performing an etching process to initiate V-defects, wherein an opening is created in at least one first sublayer and at least one second sublayer during the etching process, the opening extending completely through the at least one first sublayer and the at least one second sublayer;

growing a second layer on the first layer; and growing a quantum film structure on the second layer, wherein the quantum film structure has a third indium content that is higher than the first indium content, wherein the second layer and the quantum film structure are grown in a region of the V-defects.

14. The method according to claim 13, wherein the first indium content amounts to between 0% and 12%.

15. The method according to claim 14, wherein the second indium content amounts to at most 6%.

16. The method according to claim 13, wherein the second layer has a thickness of between 1 nm and 120 nm.

17. The method according to claim 13, wherein the first sublayer has a thickness of between 0.5 nm and 10 nm and the second sublayer has a thickness of between 0.5 nm and 30 nm.

18. A method for producing an optoelectronic semiconductor chip, the method comprising:

providing a substrate;

growing a first layer, wherein the first layer includes a plurality of first sublayers with a first indium content, and a plurality of second sublayers with a second indium content, and wherein the first layer comprises successive first sublayers and second sublayers alternating one another;

after growing the first layer, performing an etching process to initiate V-defects, wherein an opening is created in several first sublayers during the etching process, the opening extending completely through the several first sublayers;

after performing the etching process, growing a second layer; and after growing the second layer, growing a quantum film structure, wherein an active layer of the optoelectronic semiconductor chip is disposed in the quantum film structure.

* * * * *